US007382625B2

(12) United States Patent
Thornton et al.

(10) Patent No.: US 7,382,625 B2
(45) Date of Patent: Jun. 3, 2008

(54) COMBINATION ANTENNA AND SIM CARD SUPPORT STRUCTURE

(75) Inventors: Curtis W. Thornton, Raleigh, NC (US); Brian Francis Mellage, Raleigh, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 11/465,829

(22) Filed: Aug. 21, 2006

(65) Prior Publication Data

US 2007/0173123 A1 Jul. 26, 2007

Related U.S. Application Data

(60) Provisional application No. 60/761,290, filed on Jan. 23, 2006.

(51) Int. Cl.
*H05K 7/02* (2006.01)

(52) U.S. Cl. ...................... 361/737; 361/760; 361/736; 343/702; 235/492; 439/945; 439/946

(58) Field of Classification Search ................ 439/945, 439/946, 76.1, 638, 639; 361/737, 736, 752, 361/800, 816, 818; 343/702, 700 MS; 235/492, 235/441; 455/90; 174/350
See application file for complete search history.

(56) References Cited

U.S. PATENT DOCUMENTS 5,472,351 A * 12/1995 Greco et al. ................ 439/353
5,657,028 A * 8/1997 Sanad ................ 343/700 MS
5,929,815 A * 7/1999 Elderfield .................. 343/702
5,949,379 A * 9/1999 Yang .......................... 343/702
6,018,461 A * 1/2000 Biermann et al. .......... 361/737

(Continued)

FOREIGN PATENT DOCUMENTS

DE 29621835 3/1997

(Continued)

OTHER PUBLICATIONS

Sony Ericsson Mobile Communications AB, International Application No. PCT/US06/038082, International Search Report, Feb. 9, 2007.

(Continued)

*Primary Examiner*—Tuan T. Dinh
*Assistant Examiner*—Dameon E Levi
(74) *Attorney, Agent, or Firm*—Frederick D. Bailey; Moore & Van Allen, PLLC

(57) ABSTRACT

An express card adapted to receive and utilize a SIM card that can be electrically coupled with a computer is disclosed. The express card includes an extended portion with a printed circuit board (PCB) and a SIM card connector for coupling a SIM card with the PCB. An external antenna jack is electrically coupled with the PCB extended portion. An antenna/SIM card support structure is mounted on the PCB extended portion covering the SIM card connector. The antenna/SIM. card support structure forms a slot adapted to receive and seat a SIM card and form an electrical connection between the SIM card and the SIM card connector. A metallic flex antenna can be affixed to the antenna/SIM card support structure such that the antenna characteristics of an external antenna can be affected based on the metallization pattern and placement of the metallic flex antenna.

6 Claims, 7 Drawing Sheets

U.S. PATENT DOCUMENTS

| | | | | |
|---|---|---|---|---|
| 6,122,178 | A * | 9/2000 | Andrews et al. | 361/800 |
| 6,133,884 | A * | 10/2000 | Talvitie et al. | 343/702 |
| 6,261,128 | B1 * | 7/2001 | Heim et al. | 439/630 |
| 6,295,031 | B1 * | 9/2001 | Wallace et al. | 343/702 |
| 6,327,153 | B2 * | 12/2001 | Rauhala et al. | 361/737 |
| 6,327,154 | B1 * | 12/2001 | Gauld et al. | 361/737 |
| 6,377,218 | B1 * | 4/2002 | Nelson et al. | 343/702 |
| 6,400,931 | B1 * | 6/2002 | Inkinen et al. | 455/90.1 |
| 6,417,809 | B1 * | 7/2002 | Kadambi et al. | 343/702 |
| 6,434,010 | B1 * | 8/2002 | Hsu | 361/737 |
| 6,518,927 | B2 * | 2/2003 | Schremmer et al. | 343/702 |
| 6,556,170 | B2 * | 4/2003 | Northey | 343/700 MS |
| 6,590,779 | B2 * | 7/2003 | Ohki | 361/737 |
| 6,686,884 | B2 * | 2/2004 | Back et al. | 343/700 MS |
| 6,735,656 | B2 * | 5/2004 | Hanke et al. | 710/301 |
| 6,754,083 | B1 * | 6/2004 | Lin | 361/737 |
| 6,849,801 | B2 * | 2/2005 | Ming-Hui et al. | 174/372 |
| 6,850,197 | B2 * | 2/2005 | Paun | 343/702 |
| 6,877,995 | B1 * | 4/2005 | Chen | 439/76.1 |
| 6,888,724 | B2 * | 5/2005 | Shaie | 361/719 |
| 6,945,461 | B1 * | 9/2005 | Hien et al. | 235/451 |
| 6,961,022 | B1 * | 11/2005 | Tay et al. | 343/702 |
| 6,976,624 | B2 * | 12/2005 | Hsiao | 235/451 |
| 7,038,916 | B2 * | 5/2006 | Chen | 361/737 |
| 7,059,913 | B1 * | 6/2006 | Chen | 439/638 |
| D533,505 | S * | 12/2006 | Chen | D13/147 |
| 7,149,481 | B2 * | 12/2006 | Okako et al. | 455/90.3 |
| 7,173,826 | B1 * | 2/2007 | Chiou et al. | 361/737 |
| 7,290,716 | B2 * | 11/2007 | Ito | 235/492 |
| 2004/0190265 | A1 | 9/2004 | Shaie | |
| 2005/0079892 | A1 | 4/2005 | DeVos et al. | |
| 2006/0129736 | A1 * | 6/2006 | Kuehnel et al. | 710/313 |

FOREIGN PATENT DOCUMENTS

| | | | |
|---|---|---|---|
| EP | 0 910 022 | | 4/1999 |
| EP | 0910022 | A2 | 4/1999 |
| EP | 0 967 563 | | 12/1999 |
| EP | 0967563 | A2 | 12/1999 |
| EP | 1 128 465 | | 8/2001 |
| EP | 1128465 | A2 | 8/2001 |
| EP | 1291804 | | 3/2003 |
| GB | 2374204 | | 10/2002 |
| JP | 2004-343504 | * | 12/2004 |
| JP | 2004343504 | | 12/2004 |
| JP | 2004363848 | | 12/2004 |
| WO | 02/089039 | | 11/2002 |
| WO | WO02/089039 | | 11/2002 |

OTHER PUBLICATIONS

Sony Ericsson Mobile Communications AB, International Application No. PCT/US06/038082 "Written Opinion", Feb. 9, 2007.

Sony Ericsson Mobile Communications AB, International Preliminary Report on Patentability, corresponding to International Patent Application No. PCT/US2006/038082 dated Jan. 8, 2008.

* cited by examiner

COMBINATION ANTENNA AND SIM CARD SUPPORT STRUCTURE

CROSS-REFERENCE TO RELATED APPLICATIONS

This application is derived from and claims priority to U.S. Provisional Application No. 60/761,290 filed Jan. 23, 2006.

BACKGROUND

To assist in the development of several new cellular module products, a hardware approach labeled "core" component layout has been established. The core comprises major radio components that make up a certain technology (RF standards and/or protocols) such as, but not limited to, General Packet Radio Service (GPRS), Enhanced Data for GSM Evolution (EDGE), High Speed Downlink Packet Access (HSDPA), and Universal Mobile Telecommunications System (UMTS). Each technology may be implemented using various form factors, so the core and its associated routing is grouped together on the printed circuit board (PCB). This saves time and money in the development of each new form factor.

For instance, one new form factor in the PC card market is known as the "Express Card 34" (hereinafter 'express card'). This new PC card form factor is used in all types of computers especially laptop or notebook computers to replace the current PCMCIA card. With this product, however, a mechanical challenge is created for many RF applications due to the reduced PCB surface area on the standard card. Many RF applications that utilize the aforementioned technologies (GPRS, EDGE, HSPDA, UMTS) require the use of a SIM card to facilitate network identification, level of service for an account, billing, etc. A SIM card, however, has its own form factor that takes up space. Therefore, the present invention proposes positioning the SIM card nearer the antenna in a new and novel way as described below.

SUMMARY

In a first embodiment, an express card that can be electrically coupled with a computer is adapted to receive and utilize a SIM card for RF applications. The express card extends beyond the standard length of an express card by an extended portion and includes a printed circuit board (PCB) for seating electrical components. A SIM card connector is mounted on the PCB extended portion for coupling a SIM card with the electronics on the PCB. In addition. an external antenna jack mounted on and electrically coupled with the PCB extended portion. An antenna/SIM card support structure is also mounted on the PCB extended portion that covers the SIM card connector. The antenna/SIM card support structure forms a slot adapted to receive and seat a SIM card such that an electrical connection is formed between the SIM card and the SIM card connector.

The express card can optionally accommodate a metallic flex antenna affixed to the antenna/SIM card support structure such that the antenna characteristics of an external antenna can be affected based on the metallization pattern and placement of the metallic flex antenna on the antenna/SIM card support structure. An interface pin connector for electrically coupling the express card with the computer is also provided.

In a second embodiment, an express card that can be electrically coupled with a computer is adapted to receive and utilize a SIM card for RF applications. The express card includes a printed circuit board (PCB) for seating electrical components. The PCB extends beyond the standard length of the express card by an extended portion. An antenna/SIM card support structure is mounted on the PCB extended portion such that a volume of usable PCB surface space remains available between the top surface of the PCB and the bottom surface of the antenna/SIM card support structure. The antenna/SIM card support structure further includes a slot adapted to receive and seat a SIM card above the PCB such that an electrical connection can be formed between the SIM card and the PCB. An external antenna jack is mounted on and electrically coupled with the PCB extended portion.

DETAILED DESCRIPTION OF THE PREFERRED EMBODIMENTS

Two embodiments for incorporating SIM cards within or on an express card are presented in this disclosure. The first embodiment shows an antenna support structure and a SIM card holder combined into one component. The SIM connector sits on the main PCB with the SIM card insertion from the end of the express card extension.

The second embodiment also combines an antenna support structure and SIM card holder into one component, but elevates the SIM card in order to provide additional surface area on the PCB for other electrical components. The SIM card can be inserted on the side of the express card using this approach thereby allowing for the extension to be smaller than that of the first embodiment.

In addition, the antenna/SIM card support component for either or both embodiments can also include a flexible or 'flex' metallic antenna affixed thereon to enhance the performance characteristics of the external antenna.

Figure 1:
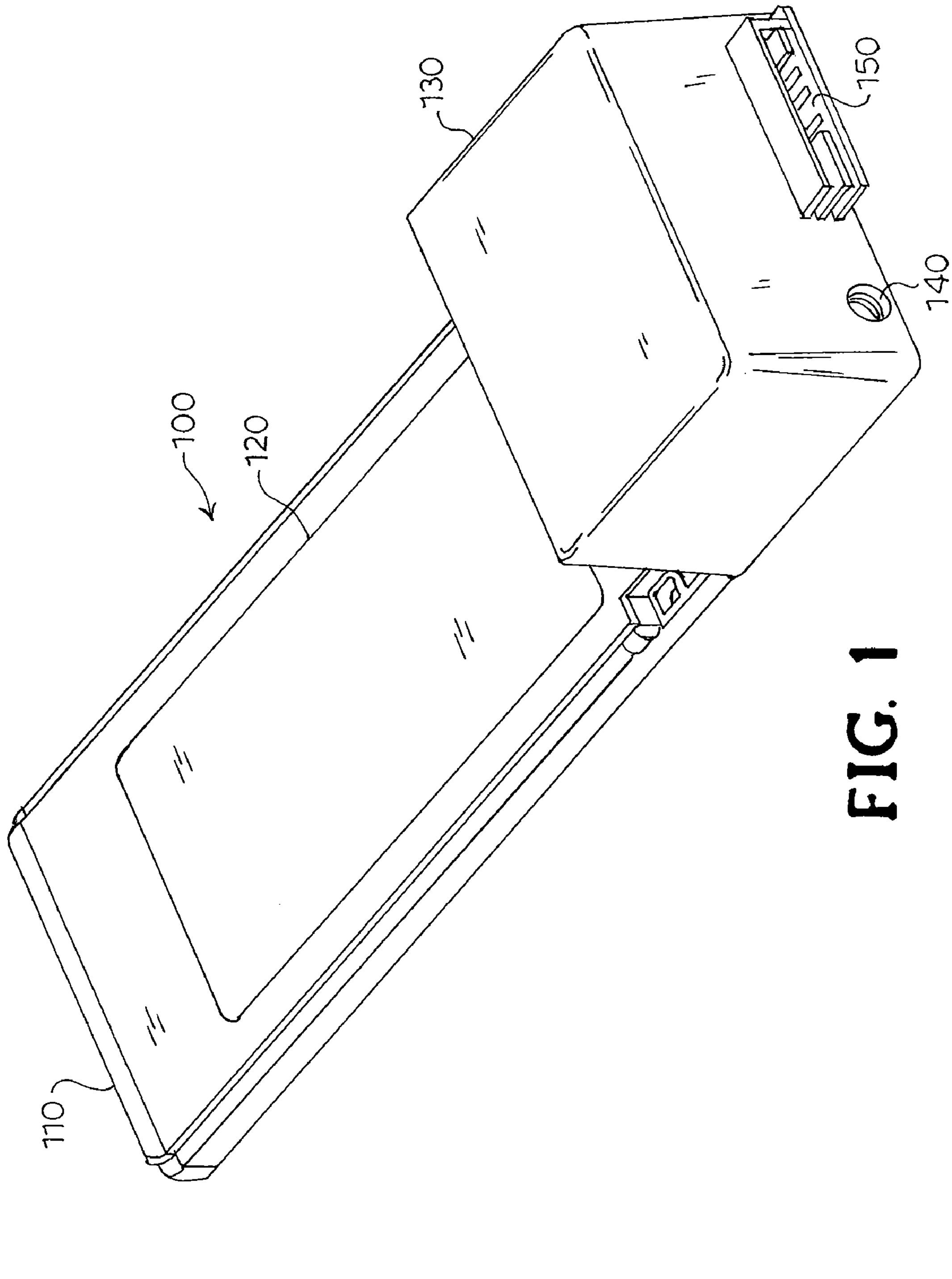
FIG. 1 illustrates one implementation of an express card according to the present invention having an extended body and including a standard card body cover and an extended card body cover.

FIG. 1 shows an express card 100 generally with a standard body cover 120 and an extended body cover 130 covering the portion that extends beyond the standard length of the express card 100. The extended body cover 130 includes a slot 150 for receiving an inserted SIM card and a connector jack 140 for an external antenna option. An interface pin connector 110 is also partially shown that couples the express card 100 to a laptop computer (not shown).

Figure 2:
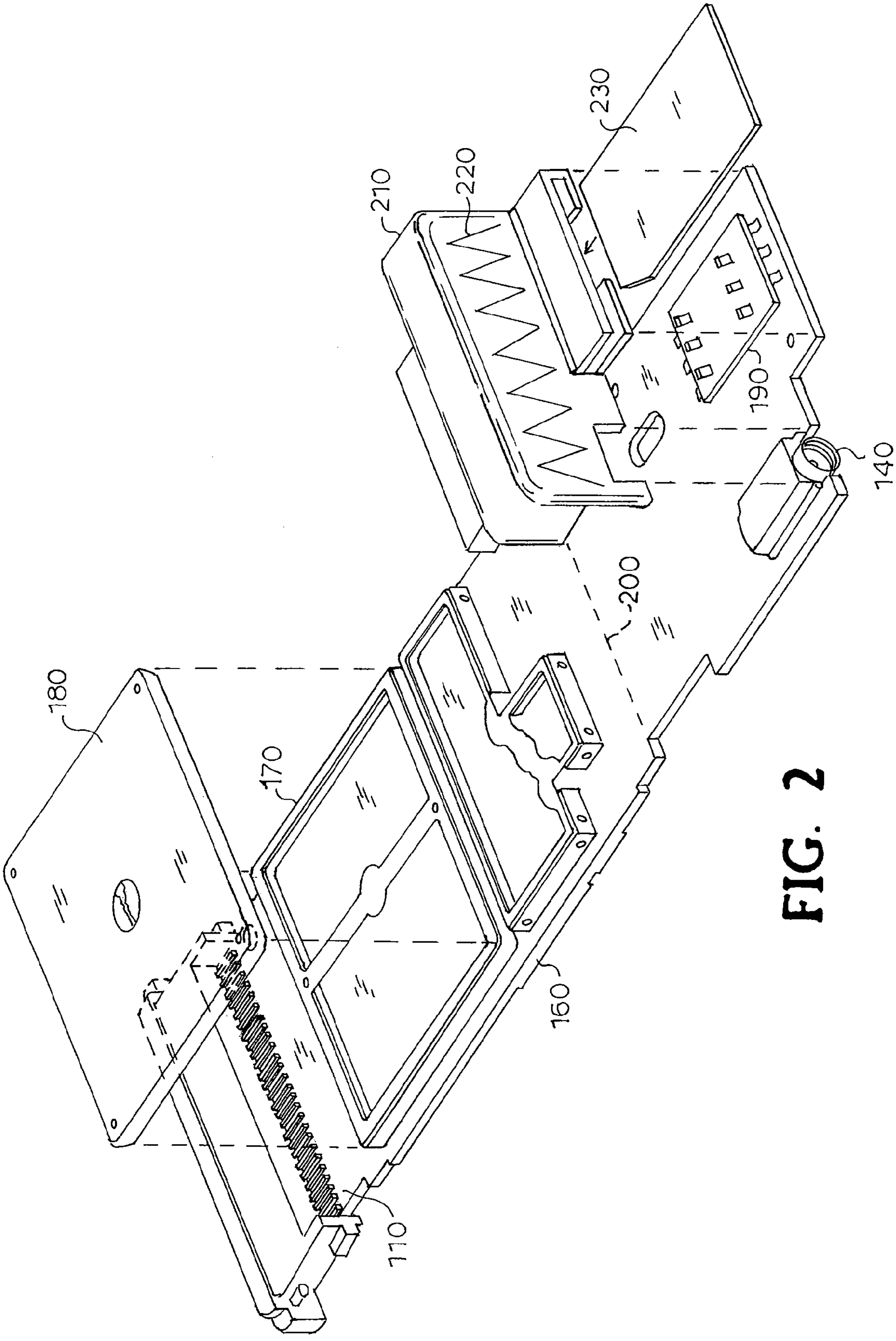
FIG. 2 illustrates an exploded view of the components for the express card of FIG. 1.

FIG. 2 illustrates an exploded view of the components for the express card of FIG. 1. The standard card body cover 120 and an extended card body cover 130 have been removed to reveal a printed circuit board (PCB) 160. The PCB 160 includes a shield frame 170 and a shield 180, a SIM card connector 190, and an external antenna jack 140. The SIM card connector 190 couples a SIM card 230 to the electronics within the express card 100 via the PCB 160. There is a dotted line 200 which indicates where the extended portion of express card 100 begins and where the standard length ends.

The express card 100 is physically limited in dimension to be less than that of the PCMCIA card that it is intended to replace. Thus, RF applications that used SIM cards previously implemented on PCMCIA cards can not use the same form factor on the new express cards due to PCB space limitations. Thus, the SIM card 230 has been moved to an extended portion of the express card to conserve the PCB area on the standard portion.

Also illustrated is an antenna/SIM card support structure 210. FIG. 2 also shows the SIM card 230 exploded to indicate where it would be inserted into the SIM card receiving slot 150 defined by the space formed when the antenna/SIM card support structure 210 is affixed to the PCB 160. FIG. 2 also shows a metallic antenna flex 220 (optional) affixed to the antenna/SIM card support structure 210. If included, the metallic antenna flex 220 can change, alter, and/or enhance the antenna characteristics of the external antenna used by the express card 100 for RF applications.

The shape, size, pattern, and orientation of the metallic antenna flex 220 can be custom designed to meet the needs of a particular RF application frequency spectrum. The antenna/SIM card support 210 is designed to receive, protect, and firmly seat the SIM card 230 so that it can be electrically coupled with the PCB components that are included on the rest of the express card 100 in order to allow the express card as a whole to perform various intended RF applications.

Figure 3:
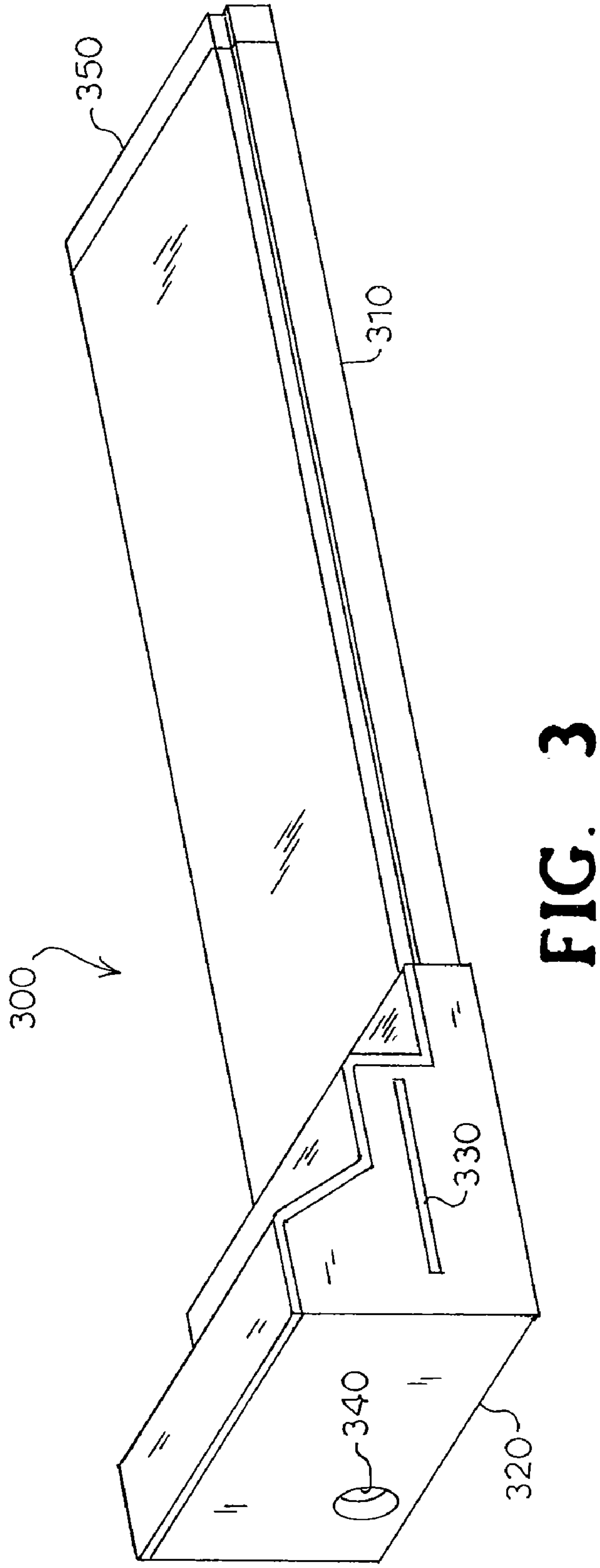
FIG. 3 illustrates another implementation of an express card according to the present invention having an extended body and including a standard card body cover and an extended card body cover.

FIG. 3 illustrates a second implementation of an express card 300 according to the present invention having an extended body portion and including a standard card body cover 310 and an extended card body cover 320. The extended body portion includes a side slot 330 for inserting a SIM card 340 and also includes an external antenna jack 370 for an external antenna option. At one end of the express card 300 an interface pin connector 350 is partially shown for coupling the express card 300 to a laptop computer (not shown). The extended card body cover 320 can be made from a low dielectric plastic in order to boost the performance of an optional internal metallic flex antenna (shown in FIG. 6).

Figure 4:
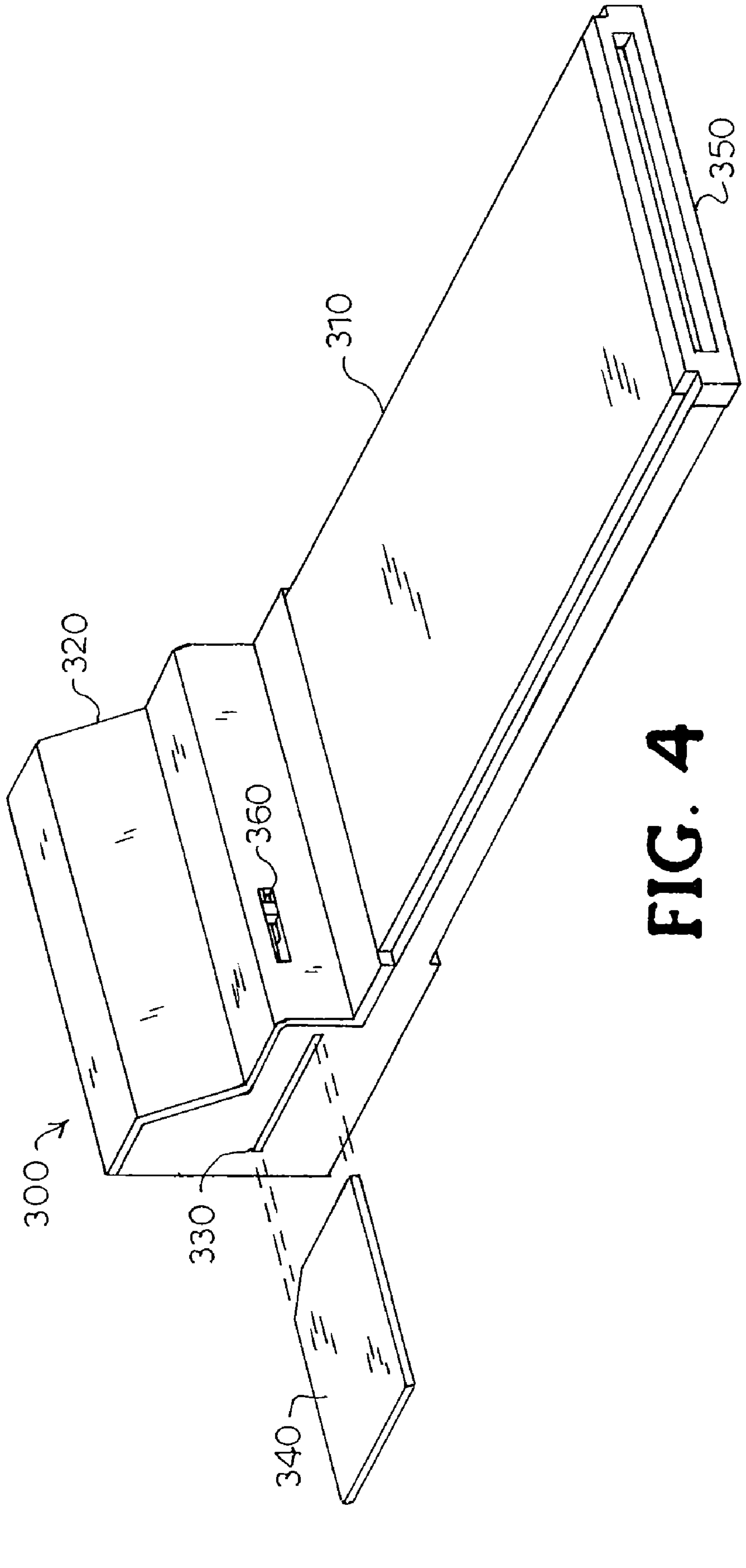
FIG. 4 illustrates the express card of FIG. 3 from a different perspective view.

FIG. 4 illustrates the express card 300 of FIG. 3 from a different perspective that shows the express card interface pin connector 350 more clearly as well as a SIM card eject mechanism 360. The position of the eject mechanism 360 prevents a user from removing the SIM card 340 from the express card 300 before removing the express card 300 from his laptop computer. Removing the express card 300 from the PC first cuts power to the SIM card 340, therefore avoiding potenial damage to the SIM card 340 that may be caused while removing a SIM card that is currently powered.

Figure 5:
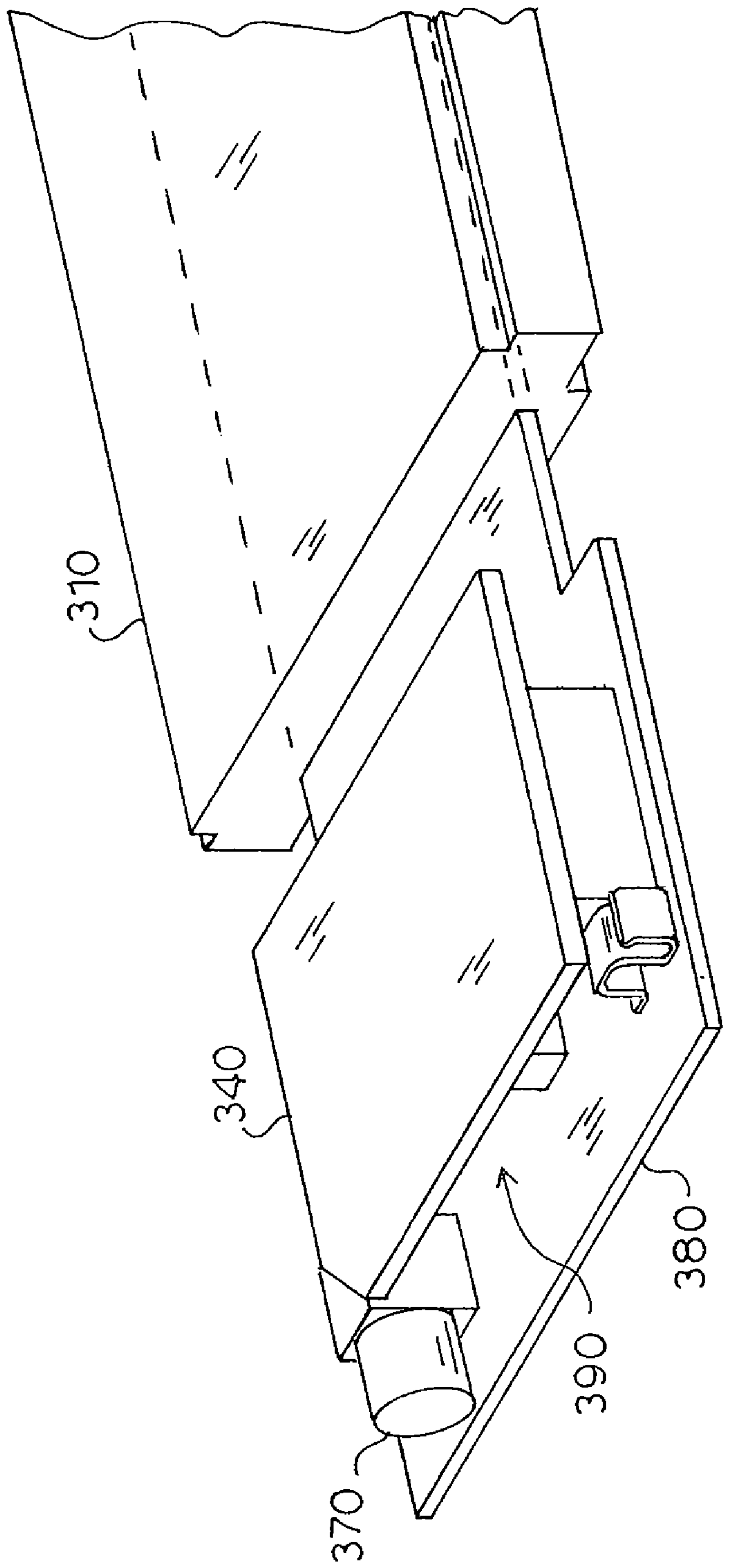
FIG. 5 illustrates the express card of FIG. 3 with the extended card body cover removed to reveal a printed circuit board (PCB) area on the extended portion beneath the SIM card.

FIG. 5 illustrates the express card 300 of FIG. 3 with the extended card body cover 320 removed to reveal an volume of space 390 on the extended portion of the express card 300 beneath where the SIM card 340 would be seated. The SIM card 340 is electrically coupled to a PCB 380. Also note that the external antenna jack 370 is sandwiched in a portion of the space 390 between the main PCB 380 and the SIM card 340.

Figure 6:
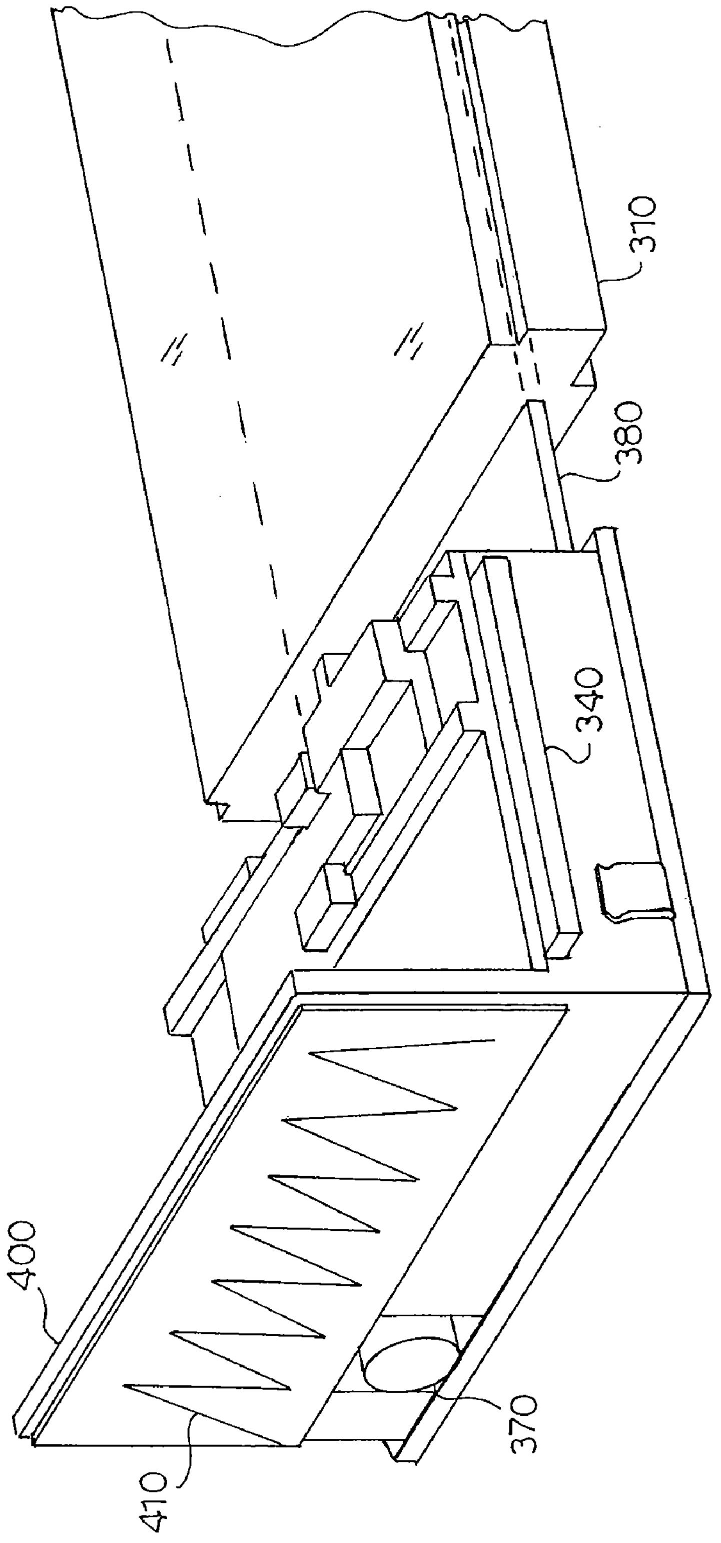
FIG. 6 illustrates the express card of FIG. 5 with an antenna/SIM card support structure included.

FIG. 6 illustrates components within the express card 300 extended portion. Here an antenna/SIM card support structure 400 is affixed to PCB 380 about its perimeter but allows for the placement of additional hardward components on the PCB 380 within the perimeter volume of space 390 created by the placement of the antenna/SIM card support structure 400 on the PCB 380. The antenna/SIM card support structure 400 also forms a surface that can accommodate an optional internal metallic flex antenna 410. The external antenna jack 370 is shown here on the end of the extended portion of the express card 300, but could also be positioned on the side opposite the entry of SIM card 340 above the PCB 380.

Figure 7:
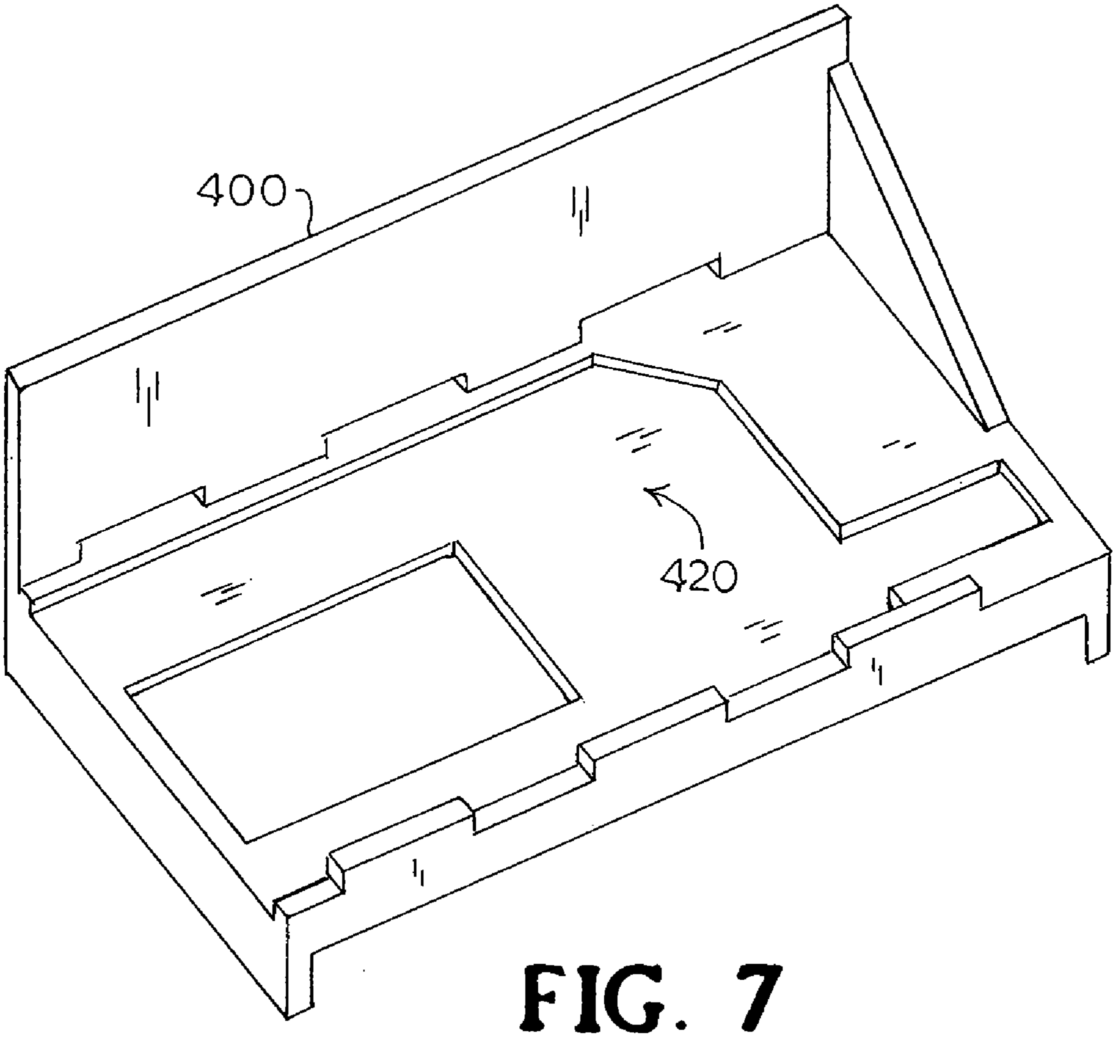
FIG. 7 illustrates the antenna/SIM card support structure.

FIG. 7 illustrates the antenna/SIM card support structure 400. The antenna/SIM card support structure 400 can be made from an engineering grade low dielectric plastic such as PC or ABS. A recessed portion 420 is shown that is adapted to receive the SIM card 340 and provide a means for an electrical coupling between the SIM card 340 and the PCB 380.

The metallization pattern of a flex antenna shown in FIG. 2, reference 220 and also in FIG. 6, reference 410 can be variable to suit a given RF application. Thus, by varying the design of the metallization pattern that can be imprinted onto the inner surface of the antenna/SIM card support structure shown in FIG. 2, reference 210 and also in FIG. 6, reference 400, the overall antenna performance characteristics of the express card of FIG. 1 or FIG. 3 can be enhanced to accommodate multiple applications and RF communication protocols.

The invention claimed is:

1. An ExpressCard/34 that can be electrically coupled with a computer, the ExpressCard/34 adapted to receive and utilize a Subscriber Identity Module (SIM) card for RF applications, the ExpressCard/34 comprising:

a printed circuit board (PCB) for seating electrical components, the PCB extending beyond a standard length of an ExpressCard/34 by an extended portion;

a SIM card connector mounted on the PCB extended portion for coupling a SIM card with the electronics on the PCB;

an external antenna jack mounted on and electrically coupled with the PCB extended portion; and an antenna/SIM card support structure mounted on the PCB extended portion and covering the SIM card connector, the antenna/SIM card support structure forming a slot adapted to receive and seat a SIM card such that an electrical connection is formed between the SIM card and the SIM card connector.

2. The ExpressCard/34 of claim 1 further comprising a metallic flex antenna affixed to the antenna/SIM card support structure such that the antenna characteristics of an external antenna can be affected based on the metallization pattern and placement of the metallic flex antenna on the antenna/SIM card support structure.

3. The ExpressCard/34 of claim 1 further comprising an interface pin connector for electrically coupling the ExpressCard/34 with the computer.

4. An ExpressCard/34 that can be electrically coupled with a computer, the ExpressCard/34 adapted to receive and utilize a Subscriber Identity Module (SIM) card for RF applications, the ExpressCard/34 comprising:

a printed circuit board (PCB) for seating electrical components, the PCB extending beyond the standard length of the ExpressCard/34 by an extended portion;

an antenna/SIM card support structure mounted on the PCB extended portion such that a volume of usable PCB surface space remains available between the top surface of the PCB and the bottom surface of the antenna/SIM card support structure, the antenna/SIM card support structure including a slot adapted to receive and seat a SIM card above the PCB such that an electrical connection can be formed between the SIM card and the PCB; and an external antenna jack mounted on and electrically coupled with the PCB extended portion.

5. The ExpressCard/34 of claim 4 further comprising a metallic flex antenna affixed to the antenna/SIM card support structure such that the antenna characteristics of an external antenna can be affected based on the metallization pattern and placement of the metallic flex antenna on the antenna/SIM card support structure.

6. The ExpressCard/34 of claim 4 further comprising an interface pin connector for electrically coupling the ExpressCard/34 with the computer.

* * * * *